United States Patent [19]

Fujimori

[11] Patent Number: 5,966,005
[45] Date of Patent: Oct. 12, 1999

[54] LOW VOLTAGE SELF CASCODE CURRENT MIRROR

[75] Inventor: Ichiro Fujimori, Sagamihara, Japan

[73] Assignee: Asahi Corporation, Japan

[21] Appl. No.: 08/993,030

[22] Filed: Dec. 18, 1997

[51] Int. Cl.[6] ................................................ G05F 3/16
[52] U.S. Cl. ............................................................ 323/315
[58] Field of Search .................................. 323/315, 312; 327/404

[56] References Cited

U.S. PATENT DOCUMENTS

| | | |
|---|---|---|
| 4,477,482 | 10/1984 | Swanson . |
| 4,550,284 | 10/1985 | Sooch . |
| 4,618,815 | 10/1986 | Swanson . |
| 4,983,929 | 1/1991 | Real et al. . |
| 5,311,115 | 5/1994 | Archer . |
| 5,359,296 | 10/1994 | Brooks et al. . |
| 5,401,987 | 3/1995 | Hiser et al. . |
| 5,796,767 | 8/1998 | Aizawa ..................................... 372/38 |

OTHER PUBLICATIONS

Castello, R. et al., "A 500–nA Sixth–Order Bandpass SC Filter," IEEE Journal of Solid–State Circuits, vol. 25, No. 3, Jun. 1990, pp. 669–676.

Tsividis, Y, *Operation and Modeling of The MOS Transistor*, McGraw Hill Book Co., 1987, Preface and pp. 169–191.

Allen, et al, *CMOS Analog Circuit Design*, Harcourt Brace Jovanovich College Publishers, 1987, Preface and pp. 218–239.

*Primary Examiner*—Shawn Riley
*Attorney, Agent, or Firm*—Kevin L. Daffer; Conley, Rose & Tayon

[57] ABSTRACT

An integrated circuit is provided for sourcing a mirrored current into a high impedance output node. A load may be coupled to the output node, and the mirrored current may be derived proportional to or substantially equal to current forwarded from a reference current source. The integrated circuit, or current mirror, includes a pair of series-connected output transistors coupled between the output node and a reference terminal. One of the output transistors is dimensioned with a channel that is short enough to ensure the threshold voltage of that transistor is smaller than the threshold voltage of the other transistor having a longer channel. Thus, one transistor utilizes the benefits of high density integrated circuit manufacture and, more specifically, short channel effects arising from channel length less than, e.g., 1.0 microns. The difference in threshold voltages between the pair of output transistors, and mutually connecting gates of those transistors helps maximize the output impedance and voltage swing from the output node of the current mirror while minimizing voltage needed to operate the current mirror.

16 Claims, 5 Drawing Sheets

LOW VOLTAGE SELF CASCODE CURRENT MIRROR

BACKGROUND OF THE INVENTION

1. Field of the Invention

This invention relates to an integrated circuit and, more particularly, to a metal oxide semiconductor ("MOS") circuit or method for providing current from a self cascode transistor arrangement having differing gate lengths to maximize output impedance and voltage swing from the circuit while minimizing voltage needed to operate the circuit.

2. Description of the Related Art

There are many techniques used to provide regulated current to a load circuit. One technique involves a current mirror. A conventional current mirror provides output current proportional to an input current. Separation between the input and output current ensures the output current can drive high impedance loads. Conventional current mirror designs have been implemented in both bipolar and MOS technology. MOS devices with short channel lengths and therefore faster operation have provided an impetus toward current mirrors based on MOS technology.

An important aspect in designing an MOS current mirror is to achieve optimum matching between the input (or "bias") current and the output current. Typically, the output current is designed to traverse a load placed across output terminals of the current mirror. The bias current is generally derived from a current source linked to a bias transistor. The bias transistor receives the bias current and produces a proportional bias voltage. The bias voltage is then placed on an output transistor configured to replicate (or "mirror") the bias current. Properly mirrored output current assumes the bias transistor and output transistor are fabricated with similar traits. For this reason, most modern day current mirrors are fabricated on a monolithic substrate as part of an integrated circuit.

FIG. 1 is a conventional current mirror 10 shown in simplistic form. A pair of MOS transistors Q1 and Q2 are shown having their gate terminals mutually connected, along with mutually connected source terminals. Since both transistors are fabricated on a monolithic substrate consistent with one another, the transistors operate in similar fashion. That is, transistors Q1 and Q2 can be n-type transistors or p-type transistors. Transistor Q1 is connected as a diode, whereby the gate terminal is shorted to the drain terminal.

The threshold voltage (Vt) of transistor Q1 is designed to be substantially the same as transistor Q2. Likewise, the voltage across the source and drain terminals (Von) of transistor Q1 when that transistor is in saturation is similar to Von across the source and drain terminals of transistor Q2. The bias current (Ibias) applied to transistor Q1 generates a bias voltage (Vbias) at the gate terminal of transistor Q1. Vbias is substantially equal to the threshold voltage (Vt) of transistor Q1, along with additional turn-on voltage (Von) required for current flow of Ibias. The relation between Von and Ibias is described in the following equations, and is sometimes referred to as the MOS square law relationship:

$$Ibias = K * W/L * (Vgs-Vt)^2,$$

where K is the MOS gain factor, W is the channel width, L is the channel length and Vgs is the gate-to-source voltage, and where $$Von = Vgs - Vt,$$

which reduces to $$Von = (Ibias/(K*W/L))^{1/2}$$

Von is generally referred to as the saturation voltage of the transistor. If the drain-to-source voltage (Vds) of the transistor is larger than voltage Von, the transistor will operate in the "saturation" region. On the contrary, if Vds is lower than Von, the transistor will enter the "linear" region which, when entered, significantly degrades the gain and output impedance properties of the transistor.

In the instance shown, the diode-connection of transistor Q1 forces Vds of that transistor to be Vt+Von, which is larger than Von such that transistor Q1 is automatically placed in saturation. Whether transistor Q2 is in saturation or not depends on the drain voltage of node 12. The threshold voltage Vt of transistor Q1 is designed to be substantially the same as transistor Q2. Likewise, the Von of transistor Q1 is similar to Von of transistor Q2.

If transistors Q1 and Q2 in FIG. 1 have matched parameters (channel width, channel length, threshold voltage, etc.) current Ibias will be reproduced or mirrored through transistor Q2 as Iout. Furthermore, the mirrored current Iout will flow through whatever circuit is connected to output node 12. A circuit connected to output node 12 (interchangeably referred to as "Vout") is referred to as the load of the current mirror 10.

Proper design of a current mirror must take into account at least three important characteristics involved in all current mirrors. First, the output impedance as measured upon the output node must be as large as possible. If the output impedance between node 12 and a reference supply applied to node 14 is quite large, then changes in Vout will not substantially effect Iout. Thus, output impedance is often used to evaluate the stability of the current mirror. In the example shown in FIG. 1, output impedance is equal to the impedance across transistor Q2 and is inversely proportional to a channel length modulation factor λ of that transistor, as follows:

$$Rout = R_{Q2} = 1/(\lambda * Iout)$$

A second parameter used in evaluating current mirrors is the output swing, or range, of Vout. At times when the load of the current mirror operates linearly the output swing measured at node 12 should be as high as possible to add to the robustness at which a load circuit can operate when connected to Vout. One edge of the output swing is limited by the saturation voltage (i.e., voltage to maintain saturation) of the load and/or transistor Q2. As defined above, the saturation voltage of transistor Q2 between the source and drain terminals is Von. The smaller the value of Von, the higher the output swing available to a load connected at node 12. In the example provided in FIG. 1, the saturation voltage of the load is equal to the saturation voltage Von of transistor Q2. It is desirable to minimize the saturation voltage Von of the output transistor Q2, and therefore to maximize the output swing available to a load device.

A third criteria involves the voltage required to operate the current mirror. This voltage is often referred to as the minimum operating voltage. The extent at which the operating voltage can be minimized is limited by the voltage required to bias the output transistor. Thus, in many cases, the minimum operating voltage is equal to Vbias. In the example of FIG. 1, the minimum operating voltage is Vt+Von. The three characteristics of a current mirror attributed to the exemplary circuit of FIG. 1 is shown below in reference Table I:

TABLE I

| Output Impedance | $R_{Q2}$ |
|---|---|
| Saturation Voltage | Von |
| Bias Voltage | Vt + Von |

The main disadvantage of current mirror 10 shown in FIG. 1 is the dependence between the output impedance and the channel length modulation factor λ of transistor Q2. The channel length modulation factor will increase with shorter channel lengths. This means that the output impedance $R_{Q2}$ will decrease with shorter channel lengths. As the densities of modern day integrated circuits increase, the channel lengths will decrease. Unfortunately, the trend toward higher density circuit devices will decrease the output impedance of current mirrors formed therefrom. In modern sub-micron processes, the effect of channel length modulation becomes significant. A single output transistor Q2 employed within a current mirror and having a channel length less than, e.g., 1.0 μm will increase the output impedance to such an extent that the current mirror may be rendered useless in many applications. For example, if the output impedance is too small, DC gain will be deleteriously small if the current mirror is used as the load of an opamp.

In an effort to maintain high output impedance in submicron fabrication processes, many modern current mirrors employ a cascode arrangement. FIG. 2 illustrates a conventional cascode current mirror 18 having a cascode transistor Q4 inserted in series with transistor Q2, and cascode transistor Q3 added in series with transistor Q1. Transistor Q3 generates the bias voltage from Ibias necessary to replicate or mirror Ibias into the load device. Current mirror 18 has many features similar to current mirror 10, and therefore the similar features (i.e., output node 12 and reference voltage terminal 14, etc.) are identically numbered.

The cascode arrangement shown in FIG. 2 allows the voltage on the drain of transistor Q2 to be shielded from variations in Vout at node 12. Thus, the output impedance Rout of the load is increased by the gain of transistor Q4 as follows:

$$Rout = R_{Q2}(gm_{Q4} * R_{Q4})$$

Where $gm_{Q4}$ and $R_{Q4}$ represents the transconductance and output impedance, respectively, of transistor Q4. Since the product of $gm_{Q4}$ and $R_{Q4}$ is generally much larger than 1.0, the output impedance provided by circuit 18 is much greater than that provided by circuit 10. The disadvantage of a cascode current mirror is the reduced output swing and headroom due to the insertion of cascode transistors Q3 and Q4.

If Vt and Von of transistors Q3 and Q4 are identical, Vbias will be 2Vt+2Von, and the minimum Vout at node 12 will become Vt+2Von. The increased minimum Vout and Vbias makes the conventional cascode arrangement less desirable to low voltage circuits, or circuits which mandate minimal power consumption. Low voltage application implies the voltage swing of a load connected to node 12 must be maintained as large as possible. Consumption of that output swing and available headroom with an increase in the saturation voltage will prove detrimental to low voltage and/or power applications. Performance of cascode current mirror 18 is summarized in Table II as follows:

TABLE II

| Output Impedance | $R_{Q2}$ ($gm_{Q4}$ * $R_{Q4}$) |
|---|---|
| Saturation Voltage | Vt + 2Von |
| Bias Voltage | 2Vt + 2Von |

There have been numerous enhancements proposed to overcome the shortcomings of circuits 10 and 18. Specifically, those enhancements are derived in current mirrors having as high an output impedance as possible yet with minimal saturation and bias voltages. One example of a cascode current mirror with sufficiently high output impedance yet having minimal saturation voltage is illustrated in FIG. 3. Instead of using a single input current source and a pair of cascode bias transistors coupled to that single source, current mirror 22 of FIG. 3 uses two separate bias circuits. The separate bias transistors Q1 and Q3 are each coupled to receive current from a respective current source.

To more fully understand the differences between current mirrors 18 and 22, it is important to note how the gate and/or bias voltages upon output transistors Q2 and Q4 are derived. In circuit 18 shown in FIG. 2, the cascode-connected, bias transistors Q1 and Q3 force the drain voltage of transistor Q3 to be at Vt+Von instead of Von. Thus, the drain terminal of transistor Q2 receives an extra threshold voltage $V_t$ necessary to maintain saturation of transistor Q2. Since saturation of transistor Q4 of circuit 18 requires the gate terminal to be above the source terminal by Vt and Von, the bias voltage at the gate terminal of transistor gate 4 is equal to (Vt+Von)+(Vt+Von)=2Vt+2Von. By employing an individual bias circuit for transistor Q4 in FIG. 3, the extra Vt at the drain of transistor Q2 can be omitted. If the channel width-to-channel length ratio (i.e., the "W/L" ratio) of transistor Q3 is ¼ the W/L ratio of transistor Q1, then with the same Ibias current applied to both transistors Q1 and Q3, Vbias at the gate terminal of Q4 will be Vt+2Von. Since the drain voltage of transistor Q2 will be a sum of Vt and Von less than the bias voltage, the drain of transistor Q2 of circuit 22 will be merely Von. This will make the saturation voltage of circuit 22 at node 12 to be 2Von. This condition is usually referred to as the "high-swing condition". Note that the saturation voltage across the source and drain terminals of transistor Q4 remains as Von. If the drain voltage of transistor Q2 is merely Von, then the output voltage Vout is simply 2Von in circuit 22, rather than Vt+2Von in circuit 18.

Employing a lower Vout saturation voltage of 2Von in circuit 22 will afford a greater voltage swing of the load at node 12. Unfortunately, using two bias circuits and two separate current sources substantially increases the power dissipation within circuit 22, relative to a single bias cascode circuit 18. Accordingly, circuit 22 is not appropriate for low power applications. The following Table III summarizes the performance of circuit 22:

TABLE III

| Output Impedance | $R_{Q2}$ ($gm_{Q4}$ * $R_{Q4}$) |
|---|---|
| Saturation Voltage | 2Von |
| Bias Voltage | Vt + 2Von |

A circuit which avoids using separate bias circuits and high power consumption therewith is set forth in FIG. 4.

Circuit 26 shown in FIG. 4 essentially divides a bias transistor Q3 into separate bias transistors Q3a and Q3b. Transistors Q3a and Q3b generate an intermediate voltage (bias voltage) at the source/drain connection point, that intermediate voltage being Vt+2Von. If the W/L ratios of transistors Q3b and Q3a are, for example, 1:⅓, then the gate voltage of transistor Q3b will be approximately 2Vt+3Von. Accordingly, intermediate voltage Vbias will become Vt+2Von which biases the load in a high swing condition. Transistor Q5 is inserted in the diode connection of transistor Q1 to equalize the drain voltage to transistor Q2 in order to achieve a more accurate current mirror. The disadvantage of circuit 26 is the rather large operating voltage input to transistors Q3a and Q3b, represented as 2Vt+3Von. The rather large bias voltage is not appropriate for low voltage applications. The performance parameters of circuit 26 is summarized in Table IV as follows:

TABLE IV

| Output Impedance | $R_{Q2} (gm_{Q4} * R_{Q4})$ |
|---|---|
| Saturation Voltage | 2Von |
| Bias Voltage | 2Vt + 3Von |

A current mirror which has a relatively high output voltage swing (small saturation voltage), but which uses only one current path or bias circuit is generally referred to as a "self cascode" current mirror. Current mirror 26 shown in FIG. 4 employs this self cascode arrangement, as does current mirror 30 shown in FIG. 5. Current mirror 30 is a somewhat simplified version of current mirror 26. Instead of bifurcating bias transistor Q3 into transistors Q3a and Q3b, a resistor 32 is provided. The resistance value of resistor 32 is chosen so that a voltage of Von across resistor 32 will occur. Von across resistor 32 will be added to Vt+Von generated by the gate of transistor Q1. Thus, the voltage applied to bias transistor Q4 will be approximately Von above Vt+Von. Circuit 30 can therefore achieve an output swing similar to circuit 22 without having to add an extra biasing circuit. The disadvantage of circuit 30 is that process variations will cause the resistance of resistor 32 to fluctuate. Any fluctuation whatsoever will replicate back to and be applied upon, the gate conductor of transistor Q4. Accordingly, both the saturation voltage and the bias voltage of circuit 30 are susceptible to variations in the semiconductor fabrication process. Performance parameters resulting from circuit 30 are listed in Table V as follows:

TABLE V

| Output Impedance | $R_{Q2} (gm_{Q4} * R_{Q4})$ |
|---|---|
| Saturation Voltage | 2Von |
| Bias Voltage | Vt + 2Von |

Circuit 34, shown in FIG. 6, presents an effort to produce a current mirror circuit which is less susceptible to semiconductor fabrication process variations, does not require a separate bias circuit, and maintains maximum output impedance. Current mirror circuit 34, similar to circuit 30, includes an output node 12 and a reference supply terminal 14. However, the transistors Q1, Q2, Q3 and Q4 are of either dissimilar type or have dissimilar thresholds. For example, transistors Q1 and Q2 can be enhancement-mode transistors, while transistors Q3 and Q4 are depletion-mode transistors. This implies that transistors Q3 and Q4 operate at negative thresholds. Alternatively, transistors Q3 and Q4 can be enhancement-mode transistors, yet operate at a lesser, albeit positive, threshold from that of transistors Q1 and Q2. The lower thresholds of enhancement-mode transistors Q3 and Q4 (e.g., 200 mv rather than, e.g., 400 mv), or the negative thresholds of depletion-mode transistors proves beneficial in a conventional setting. However, a description of depletion-mode operation in general is necessary to understand why depletion transistors have negative thresholds.

Opposite enhancement transistors, depletion transistors are normally "on" unless a gate-to-source voltage exceeding Vt occurs. In other words, a bias voltage on the gate electrode of depletion transistors is needed to deplete the channel region of majority carriers, and thus turn those transistors off. NMOS depletion-mode transistors require a negative gate voltage to be turned off while corresponding PMOS transistors require a positive gate voltage to be turned off.

An additional (or dissimilar) ion implantation step may be used to modify the threshold of one transistor from that of another, or to fabricate a depletion-mode transistor separate from enhancement-mode transistors. For example, in order for the required negative threshold voltage for a depletion-mode n-type MOS device to be produced, n-type impurities are implanted between the source and drain regions to form a built-in channel. The channel remains until the threshold voltage is exceeded in absolute value, thereby depleting a channel and terminating the saturation condition. Alternatively, to form a lower threshold transistor separate from, for example, a medium threshold transistor, the channel of a lower threshold transistor must be doped lighter than the medium threshold transistor, or a counter doping must be used. Ion implant is but one way to change thresholds among transistors, another way being, e.g., a change in gate oxide thickness or doping the gate conductor by a compensating amount.

Depletion transistors are said to have a threshold voltage Vt less than zero, and lower threshold transistors have a threshold voltage Vt less than medium threshold transistors. Accordingly, the depletion transistors or lower threshold transistors Q3 and Q4 are henceforth referred to as Vt2, whereas the threshold voltages of the medium threshold transistors Q1 and Q2 are henceforth referred to as Vt1. When transistors are "on", the saturation voltage across those transistors are equal and represented as Von. If all gates are tied together, as shown in FIG. 6, the saturation voltage seen at output node 12 will be Vt1−Vt2+Von, and the minimum operating voltage (bias voltage) is Vt1+Von. If Vt1 −Vt2=Von, the saturation voltage will become 2Von. Circuit 34 achieves lowest operating voltage equal to the single MOS current mirror of FIG. 1. Moreover, the saturation voltage produced at output node 12 of circuit 34 is comparably low, at least as small as many of the other conventional circuits described above. A summary of performance parameters for circuit 34 are listed in Table VI as follows:

TABLE VI

| Output Impedance | $R_{Q2} (gm_{Q4} * R_{Q4})$ |
|---|---|
| Saturation Voltage | Vt1 − Vt2 + Von |
| Bias Voltage | Vt1 + Von |

Unfortunately, circuit 34 requires additional processing steps to implement, e.g., the implant procedures needed to produce dissimilar threshold transistors or the depletion-mode transistors separate from the enhancement-mode transistors. For example, the depletion-mode transistors require a well region in which the respective depletion-mode transistor channels are formed separate from the channels of enhancement-mode transistors. Those well regions must be implanted or doped separate from dopants placed in the enhancement-mode transistor channels. Alternatively, a threshold adjust implant may be used to lessen (or enhance) threshold of one enhancement-mode transistor from that of another. In either instance, change in threshold or transistor type requires additional fabrication steps. If the additional implantation procedure is not carefully followed, contaminants will selectively arise in transistors employing the additional steps causing a skew in their performance relative to the transistors not having such steps. This skew may cause Von to differ from transistor to transistor. Moreover, contaminants or implant skewing may vary between transistors of dissimilar mode or threshold, causing a possible shift from a desired threshold performance.

It is imperative that the parameters used in producing transistors of a current mirror be carefully matched. Not only must the sizes of the bias and output transistors be controlled, but also the processing parameters used in forming the transistors must be consistent across the monolithic substrate. Implementing additional well regions, implant steps and photolithography sequences into the overall fabrication process may jeopardize the consistent performance needed to ensure accurate mirroring of the input bias current to a high impedance output current.

SUMMARY OF THE INVENTION

The problems outlined above are in large part solved by an improved current mirror circuit hereof. The present current mirror is a self cascode current mirror that is operable at low voltages (i.e., operable at low bias voltage) but does not require extra semiconductor fabrication steps. The present current mirror also achieves relatively high output impedance, low bias voltage, and low saturation voltage for achieving a high-swing output voltage, but does not require additional processing steps necessary to fabricate depletion-mode transistors separate from enhancement-mode transistors. Thus, the improved current mirror circuit employs transistors which are all of the same mode, e.g., solely enhancement-mode transistors. Avoiding the extra photolithography, etch and implant steps, and the need for precise threshold adjust implant dosage needed to change thresholds and/or convert enhancement-mode transistors to depletion-mode transistors proves a significant advantage not only in the manufacture of the integrated circuit but also in the long-term reliability of the integrated circuit. Eliminating unnecessary processing steps significantly minimizes opportunities for contaminants to enter and be entrained within the circuit features, and also lessens the possibility of threshold skewing among transistors which should operate at the same threshold to achieve the same saturation voltage.

As feature size and particularly gate lengths decrease, the present integrated circuit takes advantage of shorter gate lengths and the short channel effects resulting therefrom. Thus, the present circuit is embodied in a fabrication process and layout scheme involving gate conductors that are relatively short (i.e., channel lengths which are relative short). Select gate conductors can be made shorter than other gate conductors, each of which are produced from a single photolithography (or patterning) step. Forming select gate conductors (or regions of gate conductors) narrower than others does not involve additional processing steps or problems associated therewith. The short gate conductors are formed on select transistors to ensure the effective gate length of those transistors produces a lowered threshold value. Thus, the present current mirror circuit involves select transistors having sufficiently small gate lengths to purposefully induce short channel effects and selectively decrease the turn-on threshold of those transistors having such effects. All other process parameters across each and every transistor remains the same. According to one embodiment, all transistor channel implants are chosen so that the thresholds are purposefully small, yet those transistors having short channel effects are made even smaller. The intended effect is to produce a bias voltage limited by a lessened threshold amount rather than being constrained to a medium threshold transistor as is the case in conventional dissimilarly implanted, medium and low threshold transistors. Simply relying on the short channel effect caused by selectively shortened gate conductors proves beneficial in achieving a current mirror with improved performance characteristics.

Broadly speaking, the present invention contemplates an integrated circuit. According to one embodiment, the integrated circuit comprises a current mirror. The current mirror includes a reference supply terminal and an output terminal. A pair of enhancement-mode transistors are coupled in series between the reference supply terminal and the output terminal. A single conductor is mutually coupled to a gate terminal of both transistors of the pair of transistors.

The mutually coupled pair of transistors can be dedicated as output transistors. A gate length of one of the output transistors is preferably made smaller than a gate length of the other of the pair of output transistors. Preferably, the output transistor having the smaller gate length is less than, e.g., 1.0 $\mu$m (microns), and more preferably is set at a minimum channel length of the process.

The transistor of the pair of output transistors having a smaller gate length takes advantage of its short channel effects, and therefore has a threshold voltage less than the other transistor within the pair of output transistors. Thus, the difference in threshold voltage between the pair of output transistors is due essentially to differences in gate length. According to one embodiment, the difference in threshold voltage between the pair of output transistors is substantially equal to a voltage across a channel (i.e., Von) of the transistor having a smaller gate length during times when the transistor having the smaller gate length is in saturation.

The present invention further contemplates an integrated circuit or current mirror including a first output transistor, a second output transistor and a means or mechanism for providing a bias voltage to those transistors. The first output transistor includes a first gate, a first source and a first drain. The second output transistor includes a second gate, a second source, and a second drain. The first source is coupled to a reference voltage terminal, and a second source is coupled to the first drain. The first and second gates are mutually coupled to one another. The second source and second drain are separated by a second channel length less than a first channel length separating the first source and first drain. This difference in separation produces short channel effects and a lowering in threshold voltage of the second output transistor less than the threshold voltage of the first output transistor.

Preferably, the bias voltage provided to the first and second gates of the first and second output transistors is proportional to, or substantially equal to, current delivered from a current source. According to another preferred embodiment, the current source is coupled to a bias transistor having a third gate, a third source and a third drain. The third drain and third gate are mutually connected in a "diode-connected" arrangement between the current source and the mutually connected first and second gates. An output current is delivered through the source and drain paths of the first and second output transistors corresponding to, proportional to, or substantially equal to the current delivered from the current source.

The present invention yet further contemplates a method for producing a current mirror circuit. The method includes routing a gate conductor of greater length across a first channel area then across the second channel area. Using the gate conductor as a mask, source and drain regions are implanted on opposite sides of the gate conductor to form a series-connected pair of transistors. The source and drain regions are implanted with substantially the same dosage and with an implant type opposite that which pre-exists within the first and second channel areas. A bias voltage can be applied to the gate conductor to induce short channel effects within the second channel sufficient to reduce the threshold voltage within that transistor. The step of routing a gate conductor includes photolithography patterning the gate conductor from a layer of conductive or semi-conductive material, wherein the length of the resulting conductor across the second channel area is less than that across the first channel area. The resulting length is chosen so that short channel effects occur within the transistors of interest. Particularly, the transistor nearest the output node is designed to have a lower threshold voltage which aids in increasing the output impedance of the series-connected pair by increasing the drain-to-source voltage of the transistor nearest the reference voltage. Thus, the improved, self cascode current mirror achieves high output impedance without having to sacrifice saturation voltage and bias voltage.

BRIEF DESCRIPTION OF THE DRAWINGS

Other objects and advantages of the invention will become apparent upon reading the following detailed description and upon reference to the accompanying drawings in which.

Figure 1:
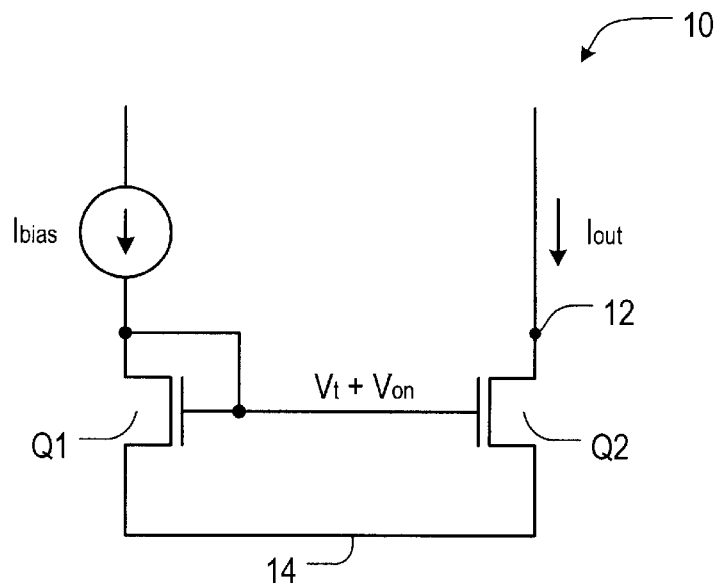
FIG. 1 is a circuit diagram of a conventional current mirror.
Figure 2:
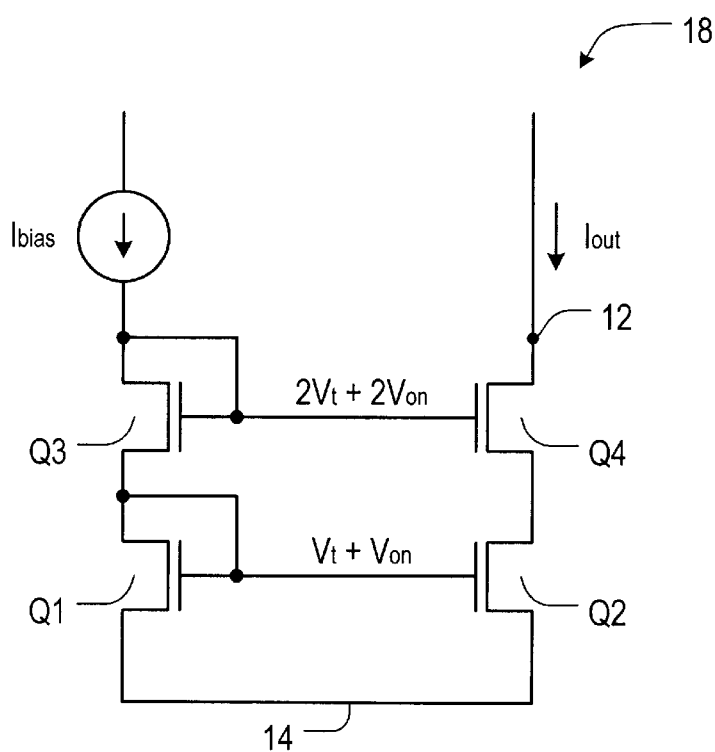
FIG. 2 is a circuit diagram of a conventional cascode current mirror.
Figure 3:
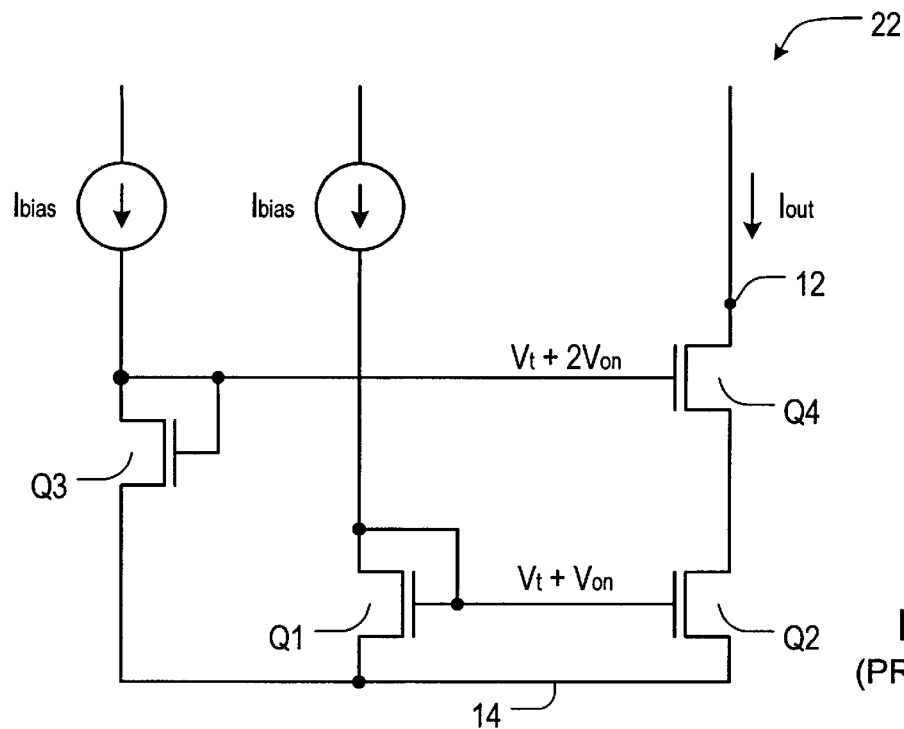
FIG. 3 is a circuit diagram of a conventional compound current mirror employing a high output voltage swing.
Figure 4:
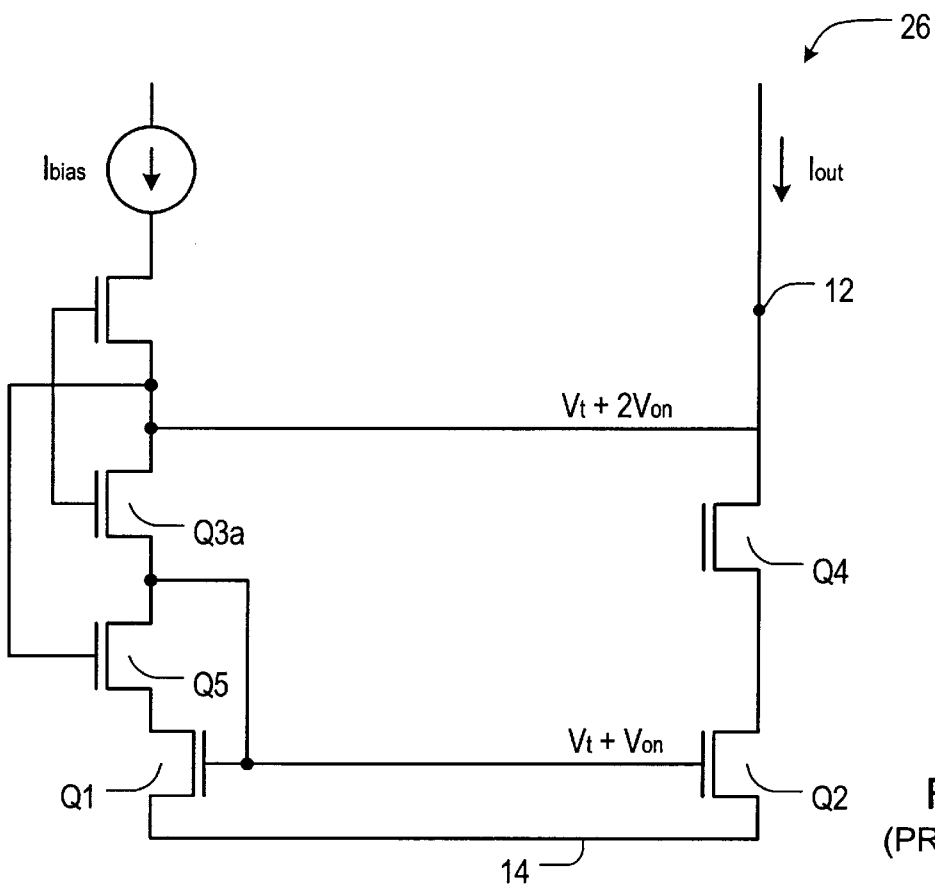
FIG. 4 is a circuit diagram of a conventional self cascode current mirror employing a high output voltage swing.
Figure 5:
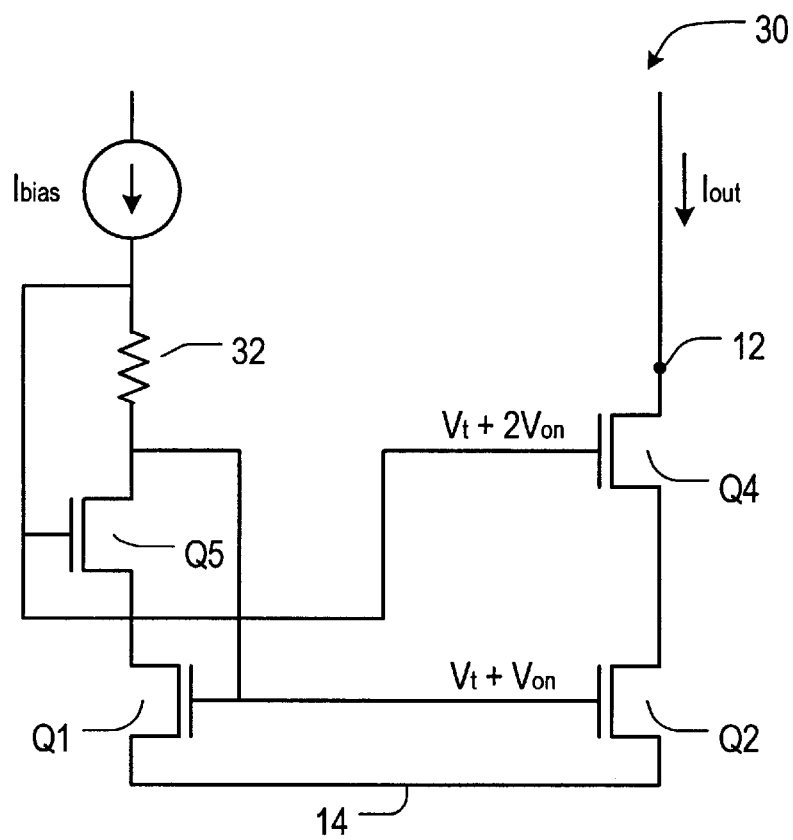
FIG. 5 is a circuit diagram of a conventional self cascode current mirror which uses a resistor to self-bias the cascode transistors.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 7:
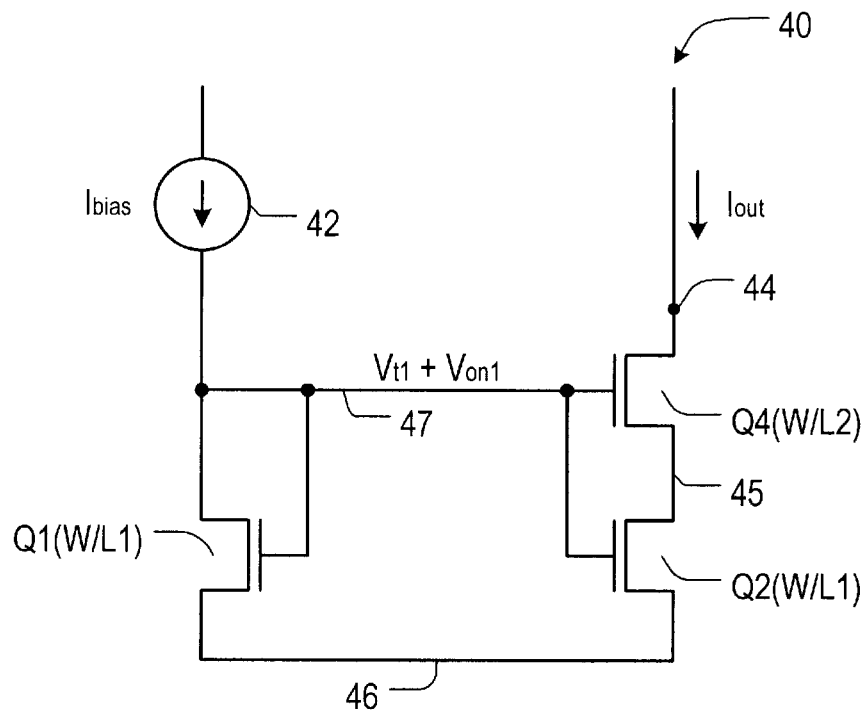
FIG. 7 is a circuit diagram of a self cascode current mirror according to one embodiment of the present invention.

Turning to FIG. 7, at least a portion of an integrated circuit 40 is shown according to one embodiment of the present invention. Integrated circuit 40 includes a current mirror circuit, wherein an input current forwarded from a current source 42 is replicated through an output node 44 as a high impedance output current Iout. Current mirror 40 can therefore be used as a current source for a load circuit coupled to output node 44. According to one example, current mirror 40 can be used to source a high-gain amplifier load circuit.

Current mirror circuit 40 includes a pair of output transistors coupled in series between output node 44 and a reference supply node 46. Node 46 can be coupled to a supply voltage such as, for example, $V_{DD}$ or ground. Current source 42 can be realized as a resistor having a voltage applied to one terminal of the resistor exceeding the voltage upon reference terminal 46. Of course, there are numerous other ways in which to produce a relatively constant current source 42.

Coupled to current source 42 is, according to one embodiment, a diode-connected transistor Q1. Transistor Q1 is diode-connected such that the gate terminal of transistor Q1 is connected to is drain terminal. The gate and drain terminals of transistor Q1 is mutually connected to the gate terminals of the series-connected output transistors Q2 and Q4. When the bias current is applied by source 42 and a reference voltage is applied at node 46, the voltage upon the gate of transistor Q1 will be one threshold above the voltage of terminal 46 and another voltage (Von 1) is needed to maintain current flow of Ibias. The ensuing voltage upon the gate of transistor Q1 will be one threshold above the voltage of terminal 46 and another voltage (Von1) needed to maintain transistor Q1 in saturation. Accordingly, the bias voltage of circuit 40 is Vt1+Von1. Vt1 represents the threshold voltage of transistor Q1. Both Vt1 and Von1 are dependent on gate length L1 of transistor Q1 and therefore are referenced different from the threshold voltage and saturation voltage across transistors having a smaller gate length L2. This configuration will force the drain voltage of transistor Q2 (shown as reference node 45) to be Vt1+Von1−Vt2−Von2, where Vt2 and Von2 is the threshold and saturation voltage of transistor Q4, respectively. The minimum swing at node 44 will then be represented as Vt1−Vt2+Von1. Vt2 represents the threshold voltage of output transistor Q4 having a gate length L2. The implants used for the various transistors Q1 through Q4 are consistently formed. Differences in threshold between bias transistor Q1 and output transistor pairs Q2 and Q4 is primarily due to the short channel effect and, more specifically, the differences in the physical gate length used to form the channel. Beneficially, transistors Q1 and Q2 have relatively large gate lengths L1, relative to the smaller gate length L2 of transistor Q4. The smaller gate length L2 affords a smaller threshold voltage Vt2 if gate length L2 is sufficiently small, e.g., less than 1.0 micron or, preferably, the minimum gate length of the given process. A smaller L2 not only lowers the saturation voltage at node 44, but also lowers Von by increasing the W/L2 ratio. If Vt2 and/or Von2 is small enough to make Vt1+Von1 −Vt2 −Von2 equal to VonI (or Vt1−Vt2 equal to Von2), then transistor Q2 will be forced into saturation. This implies a high-output impedance similar to a cascode current mirror with a low bias voltage and an operating voltage similar to a single MOS current mirror. Circuit 40 is therefore well suited for low power applications and maintains a lower saturation voltage needed for higher voltage swing at node 44.

Transistors Q1, Q2 and Q4 are all of the same mode, preferably enhancement-mode transistors. This assumes that the channel areas of each transistor may be blanket implanted at the same time, and therefore at the same dosage, opposite the source/drain dopants. Merely as an example, transistors Q1, Q2 and Q4 are shown as n-type MOS transistors. If the n-type MOS transistors are suitably enhancement-mode transistors, then the channel regions between the respective source and drain regions are p-type. The p-type implant can arise from, e.g., a threshold adjust implant concurrently applied to each transistor Q1 through Q4.

Differing gate lengths L can be produced by patterning the mutually connected conductor 47 with differing lengths (i.e., lateral thickness) over respective channel areas. Conductor 47 can include polycrystalline silicon ("polysilicon") which is patterned from a layer of polysilicon material, where the length of polysilicon traversing channels of transistors Q1 and Q2 is greater than the length traversing the channel of transistor Q4. If L2 is made to a particular length sufficient to induce short channel effects, then Vt2 is less than Vt1. If Vt1−Vt2 equals the saturation voltage of transistor Q2 (i.e., Von2), then the drain voltage of transistor Q2 is Von1. This ensures the load at node 44 is in a high swing condition. Also, since W/L2 is greater than W/L1, saturation voltage of transistor Q1 and Q2 (i.e., Von1) is larger than the saturation voltage Von2 of transistor Q4.

Figure 6:
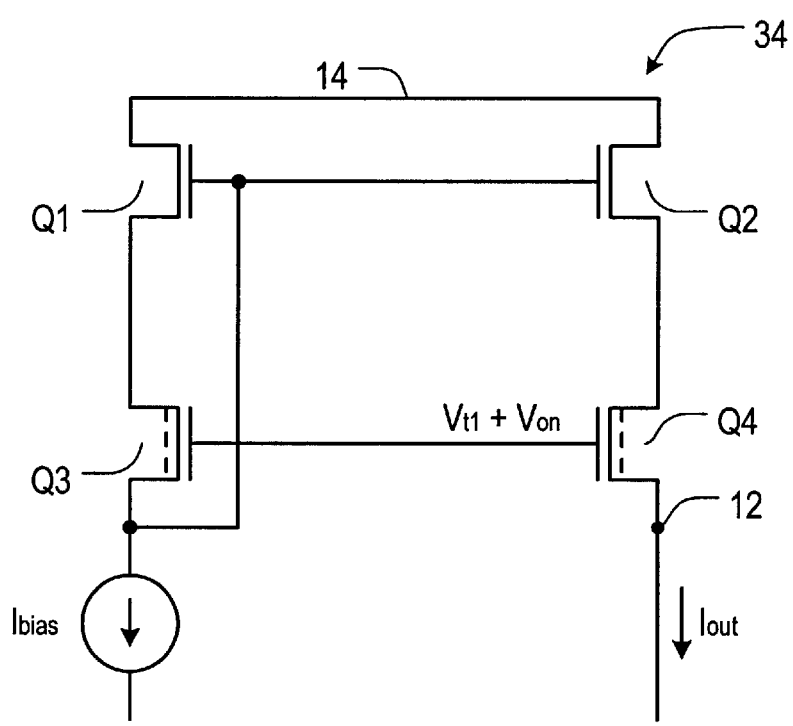
FIG. 6 is a circuit diagram of a conventional self cascode current mirror which uses depletion-mode and enhancement-mode transistors to maintain a high output impedance and output voltage swing with minimal operating voltage requirements.

The bias voltage, or minimum operating voltage of circuit 40 is Vt1+Von1, which is equal to a single MOS current mirror, similar to that shown in FIG. 1. The configuration of FIG. 7 provides low voltage operation comparable to circuit 34 shown in FIG. 6 without incurring additional processing procedures and/or problems associated therewith.

Figure 8:
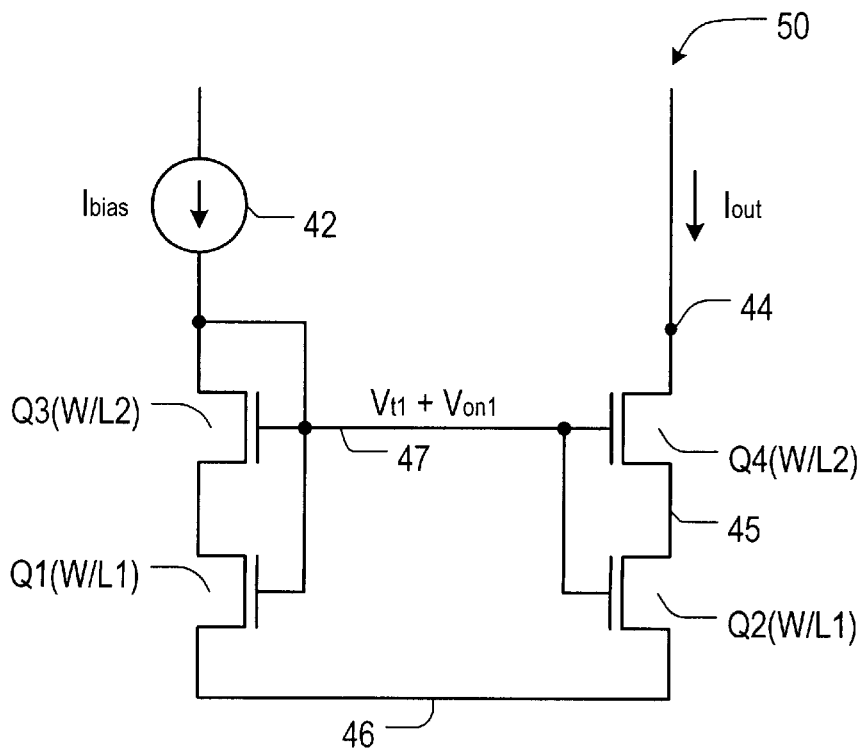
FIG. 8 is a circuit diagram of a self cascode current mirror according to another embodiment of the present invention.

If the fabrication process produces two or more types of enhancement mode transistors with different threshold voltages, the lowest threshold transistor can be used for all transistors in circuit 40, instead of combining different threshold devices as in the conventional settings. With the present configuration, relatively low operating voltage which is limited by the lower threshold is possible. FIG. 8 illustrates an additional bias transistor Q3, according to an alternative embodiment. Transistor Q3 is diode-coupled in order to enhance the accuracy of current mirror 50. However, it is understood that transistor Q3 is not essential and can be omitted if desired. All other features of circuit 50 are similar to those of circuit 40, and therefore are given similar reference numerals. The performance parameters achieved by circuit 50 or circuit 40 is summarized in Table VII as follows:

TABLE VII

| | |
|---|---|
| Output Impedance | $R_{Q2}$ (gm$_{Q4}$ * $R_{Q4}$) |
| Saturation Voltage | Vt1 − Vt2 + Von1 |
| Bias Voltage | Vt1 + Von1 |

If Vt1−Vt2 is less than Von2, the full output impedance enhancement of the cascode circuit 40 or 50 is not achieved. However, significant increase of output impedance is still present relative to a single MOS current mirror. It is desired that channel width W be the same for all transistors set forth in circuits 40 and circuit 50 for convenience in circuit layout.

A comparison of Table VII to the Tables described above will indicate circuit 40 and circuit 50 can achieve low operating voltage comparable to a single MOS current mirror. However, current mirror circuits 40 and 50 have a substantially higher output impedance than the single MOS current mirror. Similarly, circuits 40 and 50 achieve a relatively high output voltage swing with minimal power dissipation due primarily to accommodation of the self-cascode arrangement and the differences in threshold voltage between transistors forming that arrangement. Of particular important is the avoidance of extra implant or threshold adjustments often needed to form depletion-mode transistors separate from enhancement-mode transistors, or lower thresholds separate from higher thresholds. In lieu of an implant, and the contaminants or variability associated therewith, consistent threshold matching is presently achieved simply using a single channel dopant concentration (possibly formed from a single threshold implant concurrently applied to all transistor channels) and a mutually connected gate conductor.

Figure 9:
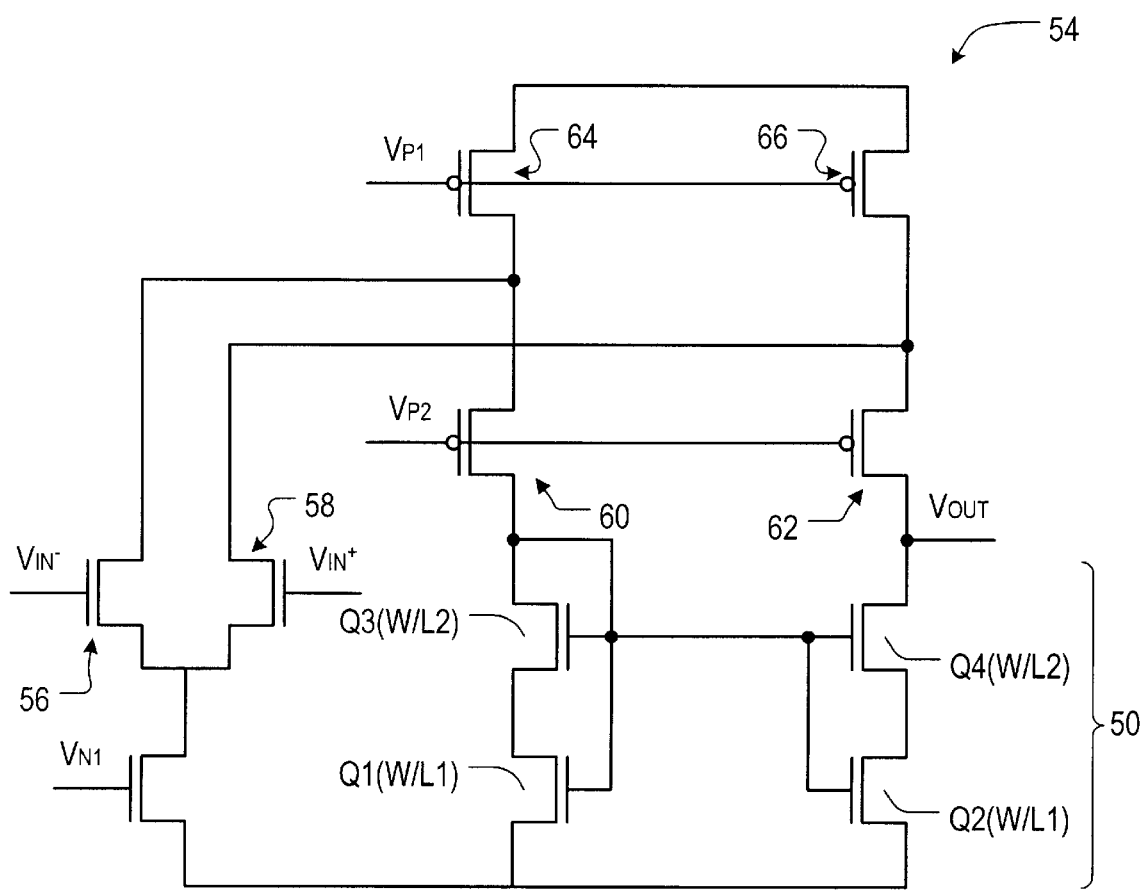
FIG. 9 is a circuit diagram of an opamp utilizing the self cascode current mirror according to one embodiment.

FIG. 9 illustrates one application for circuit 40/50 of FIGS. 7 and 8. Specifically, the current mirror can form a portion of an opamp circuit 54. Opamp 54 includes a pair of inverting and non-inverting input terminals. If, for example, Vin+ at the non-inverting input is greater than Vin− at the inverting input, then Vout will be positive. However, if Vin+ is less than Vin−, then Vout will go negative or to ground. Since transistors 64 and 66 provide equal and constant current sources, the difference of voltage input to transistors 56 and 58 will be converted to a difference in current flowing into transistors 60 and 62. The single ended, folded cascode opamp 54 utilizes the current mirror of the invention as the load. The current difference in transistors 60 and 62 will flow into the cascode load made up of the current mirror and will be converted to an absolute voltage Vout. Low voltage operation of opamp 54 is maintained similar to instances when a single MOS current mirror is used, whereby high DC gain is achieve similar to when a conventional cascode current mirror is used.

It will be appreciated by those skilled in the art having the benefit of this disclosure that this invention is believed to be capable of applications with any integrated circuit involving mirrored current from an input source to a high impedance output. Furthermore, it is also to be understood that the invention shown and described is to be taken as presently preferred embodiments. Various modifications and changes may be made to each and every feature of the integrated circuit, or the methodology of forming the integrated circuit provided beneficial performance parameters described above are achieved. It is intended that the following claims be interpreted to embrace all such modifications and changes and, accordingly, the specifications and drawings are to be regarded in an illustrative rather than a restrictive sense.

What is claimed is:

1. An integrated circuit, comprising:

a reference supply terminal and an output terminal;

a pair of MOS transistors coupled in series between the reference supply terminal and the output terminal; and a single conductor mutually coupled to a gate terminal of both said pair of transistors, wherein a gate length of the transistor within the pair of transistors coupled to the reference supply terminal is larger than a gate length of the transistor within the pair of transistors coupled to the output terminal.

2. The integrated circuit as recited in claim 1, wherein the transistor having the smaller gate length is substantially equal to a minimum gate length achievable by a semiconductor fabrication process.

3. The integrated circuit as recited in claim 1, wherein the transistor having the smaller gate length comprises a threshold voltage less than the transistor having the larger gate length, and wherein the difference in threshold voltage is due primarily to differences in gate length.

4. The integrated circuit as recited in claim 3, wherein the difference in threshold voltage is substantially equal to a minimum drain-to-source voltage needed to maintain saturation of the transistor having the smaller gate length.

5. The integrated circuit as recited in claim 1, wherein the reference supply terminal is adapted to receive a reference supply voltage.

6. The integrated circuit as recited in claim 1, wherein the reference supply voltage is a ground voltage or a voltage exceeding the ground voltage in absolute magnitude.

7. The integrated circuit as recited in claim 1, further comprising:
   a current source; and
   a diode-connected transistor coupled between the current source and the reference supply terminal, wherein a gate terminal of the diode-connected transistor is coupled to the single conductor.

8. The integrated circuit as recited in claim 1, further comprising:
   a current source; and
   another pair of transistors coupled between the current source and the reference supply terminal, wherein one of said another pair of transistors is a diode-coupled transistor having a gate terminal coupled to the single conductor.

9. The integrated circuit as recited in claim 1, wherein channel regions of the pair of nhancement-mode transistors receive substantially the same dosage and type of implant.

10. The integrated circuit as recited in claim 1, further comprising an operational amplifier circuit having a load to which the pair of enhancement-mode transistors are coupled.

11. A current mirror circuit, comprising:
    a first output transistor having a first gate, a first source and a first drain, wherein the first source is coupled to a reference voltage terminal;
    a second output transistor having a second gate, a second source and a second drain, wherein the second source is coupled to the first drain, wherein the second gate is coupled to the first gate, and wherein the second drain is coupled to an output voltage terminal;
    wherein the second source and the second drain are separated by a second channel length less than a first channel length separating the first source and the first drain, such that a threshold voltage of the second output transistor resulting from short channel effects induced on the second channel is less than a threshold voltage of the first output transistor; and
    means for providing a bias voltage to the mutually connected said first and second gates proportional to current delivered from a current source.

12. The current mirror circuit as recited in claim 11, wherein said providing means comprises a bias transistor having a third gate, a third source and a third drain, wherein the third drain and third gate are mutually connected between the current source and the mutually connected said first and second gates.

13. The current mirror circuit as recited in claim 11, further comprising an output current delivered through the source and drain paths of the first and second output transistors corresponding to the current delivered from the current source.

14. The current mirror circuit as recited in claim 11, wherein an amount by which the threshold voltage of the first output transistor exceeds the threshold voltage of the second output transistor is substantially equal to a minimum drain-to-source voltage needed to maintain saturation of the second output transistor.

15. The current mirror circuit as recited in claim 11, wherein the first and second channel lengths each receive substantially the same dosage and type of implant.

16. The current mirror circuit recited in claim 11 is adapted to coupled across a load of an operational amplifier circuit.

* * * * *

UNITED STATES PATENT AND TRADEMARK OFFICE
CERTIFICATE OF CORRECTION

PATENT NO. : 5,966,005
DATED : October 12, 1999
INVENTOR(S) : Ichiro Fujimori

It is certified that error appears in the above-identified patent and that said Letters Patent is hereby corrected as shown below:

In the Title Page:

Item [75] Assignee, please delete "Asahi Corporation" and substitute therefor --Asahi Kasei Microsystems Co., Ltd.--

Signed and Sealed this

Twenty-ninth Day of August, 2000

Attest:

Attesting Officer

Q. TODD DICKINSON
Director of Patents and Trademarks

UNITED STATES PATENT AND TRADEMARK OFFICE
CERTIFICATE OF CORRECTION

PATENT NO. : 5,966,005
DATED : October 12, 1999
INVENTOR(S) :
  Ichiro Fujimori

It is certified that error appears in the above-identified patent and that said Letters Patent is hereby corrected as shown below:

In the Claims:

Claim 9, col. 13, line 32, after "channel regions of the pair of" please delete "nhancement-mode" and substitute therefor --enhancement-mode--.

Signed and Sealed this

Fifteenth Day of May, 2001

Attest:

NICHOLAS P. GODICI

Attesting Officer    Acting Director of the United States Patent and Trademark Office